United States Patent
Coolbaugh et al.

(10) Patent No.: US 6,656,815 B2
(45) Date of Patent: Dec. 2, 2003

(54) PROCESS FOR IMPLANTING A DEEP SUBCOLLECTOR WITH SELF-ALIGNED PHOTO REGISTRATION MARKS

(75) Inventors: Douglas D. Coolbaugh, Essex Junction, VT (US); Louis D. Lanzerotti, Burlington, VT (US); John C. Malinowski, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 78 days.

(21) Appl. No.: 09/826,054

(22) Filed: Apr. 4, 2001

(65) Prior Publication Data

US 2002/0146889 A1 Oct. 10, 2002

(51) Int. Cl.$^7$ ............................................... H01L 21/76
(52) U.S. Cl. ..................... 438/401; 438/433; 438/424; 438/440; 438/526; 438/528
(58) Field of Search ................................ 438/525, 524, 438/528, 526, 402, 424, 440, 433, 401

(56) References Cited

U.S. PATENT DOCUMENTS

| | | | |
|---|---|---|---|
| 4,571,275 A | 2/1986 | Moksvold | |
| 4,644,383 A | 2/1987 | Akcasu | |
| 5,830,799 A | 11/1998 | Ammo | |
| 5,858,828 A | 1/1999 | Seliskar et al. | |
| 6,011,297 A | * 1/2000 | Rynne | 257/526 |
| 6,080,636 A | 6/2000 | Tseng | |
| 2002/0004269 A1 | * 1/2002 | Ohno | 438/221 |

FOREIGN PATENT DOCUMENTS

JP  11-297976  * 10/1999

OTHER PUBLICATIONS

English language Abstract of Japanese Patent No. JP1994000027020, issued Sep. 5, 1995.
English language Abstract of Japanese Patent No. JP1993000295726, issued Jun. 6, 1995.

* cited by examiner

Primary Examiner—Olik Chaudhuri
Assistant Examiner—Khiem Nguyen
(74) Attorney, Agent, or Firm—Scully, Scott, Murphy & Presser; William D. Sabo

(57) ABSTRACT

A method of forming a BiCMOS device having a deep subcollector region and self-aligned alignment marks is provided. The inventive method includes the steps of: (a) lithographically forming a first patterned layer comprising a thick dielectric material on a surface of a material stack formed on a semiconductor substrate, the first patterned layer including at least one opening therein and the semiconductor substrate having at least an alignment area; (b) performing a high-energy/high-dose implant through the at least one opening and the material stack so as to form at least one deep subcollector region in the semiconductor substrate; (c) lithographically forming a second patterned layer (photoresist or dielectric) predominately outside the first patterned layer in the alignment area; and (d) etching through the material stack to form alignment marks in the underlying semiconductor substrate using the first patterned layer as an alignment mark mask.

22 Claims, 3 Drawing Sheets

US 6,656,815 B2

PROCESS FOR IMPLANTING A DEEP SUBCOLLECTOR WITH SELF-ALIGNED PHOTO REGISTRATION MARKS

DESCRIPTION

1. Field of the Invention

The present invention relates to BiCMOS (bipolar complementary metal oxide semiconductor) devices, and more particularly to a method of fabricating a bipolar device having a deep subcollector region which is formed by a high-energy/high-dose implant step using a dielectric hardmask which is not adversely effected by the high-energy/high-dose implant.

2. Background of the Invention

In the fabrication of prior art bipolar devices, the subcollector regions are typically formed by first implanting a shallow As (or other like dopant ion) implant into a predetermined portion of a semiconductor substrate. An oxide is then thermally grown over the shallow implant region so as to consume end-of-range (EOR) defects that are formed during shallow implant followed by a high-temperature anneal to diffuse the As or other like dopant ion deeper into the substrate. A conventional wet etch process is then performed to remove the oxide and an epitaxial layer is grown over the implant region.

Although capable of forming deep, heavily doped, subcollector regions in the substrate, the prior art process mentioned above is costly due to the extended oxidation time typically needed to eliminate EOR defects and due to the epitaxial growth process.

In addition to the above prior art process, deep subcollector regions can be formed by high-energy implantation of an n-type dopant such as phosphorus (P), which is masked utilizing a thick resist. The use of a thick resist to form a deep subcollector region has the following limitations associated therewith:

(i) Prior art thick resists have sloped sidewalls in the range of from about 80° to about 85° prior to implantation. After high-energy implants using P or other like dopant ion at an energy of about 600 keV to about 3 MeV using doses in the range of about 1E14 to about 4E15 atoms/cm$^2$, the sidewalls of prior art resists degrade significantly to about 65° to about 70°. This degradation in sidewall slope limits the pitch of the device due to P or other like dopant ion getting thru the foot of the resist near the edge of the device. This causes an increased subcollector to subcollector ground rule to contain the implant, which consequently enlarges device size and reduces transistor packing density.

(ii) Prior art photoresist thicknesses decrease with increasing implant dose which limits the total allowable dose. In addition, the higher the implant energy, the faster the resists erodes.

(iii) Prior art resists may explode and peel up from the wafer during the implantation process unless highly specialized UV hardened photoresists are employed. This makes high-energy implants that are greater than about 1E15, 1 MeV unfeasible.

In view of the above-mentioned drawbacks in forming deep subcollector regions utilizing prior art processes, there is a continued need for developing a new and improved method of forming deep subcollector regions which overcome the prior art problems.

SUMMARY OF THE INVENTION

One object of the present invention is to provide a cost efficient method for forming deep subcollector regions which avoids the use of extended oxidation times and the need for growing an epitaxial layer after implantation.

A further object of the present invention is to provide a method of forming deep subcollector regions which does not require the use of a conventional thick resist during the implantation process, yet still provides a cost advantage over conventional diffused subcollectors.

A yet further object of the present invention is to provide a method of forming deep subcollector regions using a higher energy/higher dose implant than heretofore possible with prior art processes.

An even further object of the present invention is to provide a method of forming deep subcollector regions wherein the subcollector to subcollector ground rule to contain the implant is not significantly increased and hence dense transistor packing is preserved.

These and other objects and advantages are achieved in the present invention by utilizing a method wherein a hard dielectric mask is employed during a high-energy/high-dose implantation step. Specifically, the method of the present invention comprises the steps of:

(a) lithographically forming a first patterned layer comprising a thick dielectric material on a surface of a material stack formed on a semiconductor substrate, said first patterned layer including at least one opening therein and said semiconductor substrate having at least an alignment area;

(b) performing a high-energy/high-dose implant through said at least one opening and said material stack so as to form at least one deep subcollector region in said semiconductor substrate;

(c) lithographically forming a second patterned layer (photoresist or dielectric) predominately outside the first patterned layer in said alignment area; and (d) etching through said material stack in said alignment area to form alignment marks in the underlying semiconductor substrate using said first patterned layer as an alignment mark mask.

As stated above, the above-mentioned method forms deep subcollector regions in portions of a semiconductor substrate. Additionally, the inventive method forms alignment marks, i.e., photo registration marks, in the substrate that are self-aligned with the edges of the deep subcollector.

DETAILED DESCRIPTION OF THE INVENTION

Figure 1:
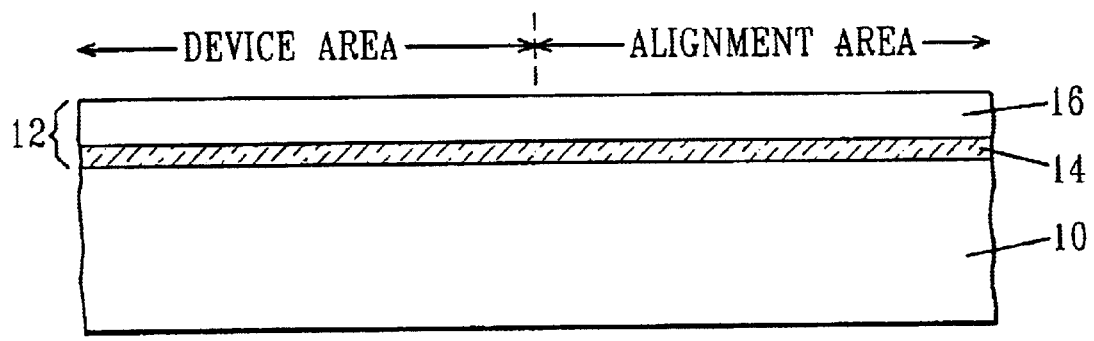
FIGS. 1–7 are cross-sectional views illustrating the basic processing steps of the present invention that are used in forming deep subcollector regions and alignment marks in a portion of a semiconductor substrate.

The present invention which provides a method of forming deep subcollector regions as well as self-aligned alignment marks in a semiconductor substrate will now be described in more detail by referring to the drawings that accompany the present application. It is noted that in the accompanying drawings, like and/or corresponding elements are referred to by like reference numerals.

Reference is first made to FIG. 1 which illustrates an initial structure that is employed in the present invention. Specifically, the structure shown in FIG. 1 comprises semiconductor substrate 10 having material stack 12 comprising pad (oxide) layer 14 and etch stop layer 16 formed thereon. Note that substrate 10 includes at least a device area and an alignment area.

The structure shown in FIG. 1 includes conventional materials well known to those skilled in the art and conventional processing steps that are also well known in the art are utilized in fabricating the same. For example, semiconductor substrate 10 comprises any semiconducting material including, but not limited to: Si, SiGe, GaAs, InAs, InP and all other III/V compound semiconductors. Layered substrates such as Si/Si or Si/SiGe and silicon-on-insulators (SOIs) are also contemplated herein. The substrate may include various devices and/or isolation regions which are not shown in the drawings for clarity, but are meant to be included within substrate 10. The semiconductor substrate may be of the n-type or p-type depending on the type of devices to be fabricated therein. Highly preferred substrates are those that contain silicon.

Pad layer 14 of material stack 12 includes any oxide material such as $SiO_2$. The pad layer is formed utilizing a conventional thermal growing process, or alternatively, a conventional deposition process such as chemical vapor deposition (CVD), plasma-assisted CVD, sputtering, evaporation, and chemical solution deposition may be employed in the present invention. The thickness of pad layer 14 may vary and is not critical to the present invention. Typically, however, pad layer 14 has a thickness of from about 5 to about 30 nm, with a thickness of from about 10 to about 20 nm being more highly preferred.

Etch stop layer 16 is typically composed of a nitride such as $Si_3N_4$, and it is formed on pad layer 14 by utilizing one of the above-mentioned deposition processes. The thickness of the etch stop layer may vary and it is also not critical to the present invention. Typically, however, etch stop layer 16 has a thickness of from about 50 to about 200 nm, with a thickness of from about 100 to about 150 nm being more highly preferred.

Although the drawings and the foregoing description illustrate the presence of two layers in the material stack, the present invention also contemplates additional layers besides those mentioned herein that can also be present in the material stack.

Figure 2:
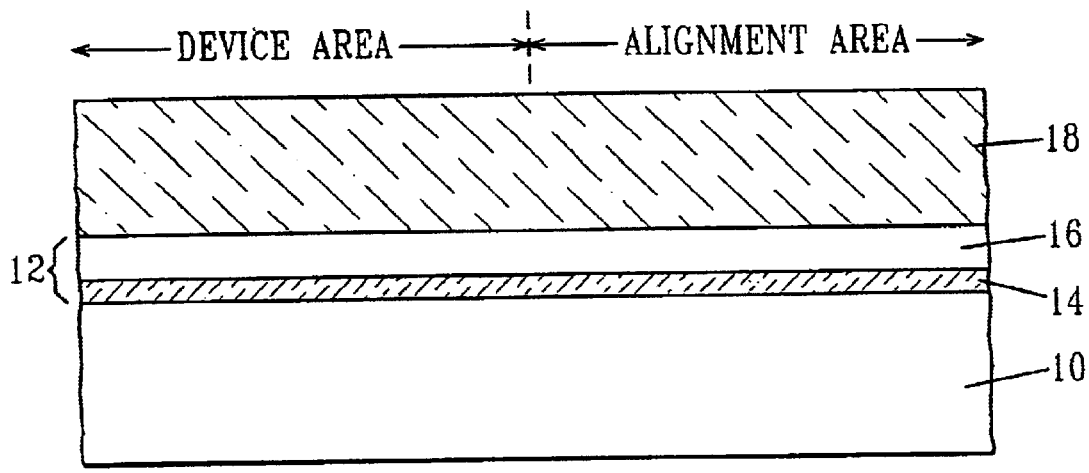

FIG. 2 illustrates the next step of the present invention wherein dielectric material 18 is formed on top of the uppermost surface of material stack 12, i.e., on top of etch stop layer 16. The dielectric material is formed on the surface of the material stack utilizing any conventional deposition process such as those mentioned hereinabove, or an oxidation or oxynitridation process may be employed in forming the same.

In accordance with the present invention, dielectric layer 18 is comprised of an oxide, an oxynitride or other like hardmask material which will not be adversely effected during the subsequent high-energy/high-dose implant step. That is, any dielectric that does not erode, explode, or have sidewalls that degrade during the high-energy/high-dose implant step may be employed in the present invention. A preferred dielectric employed as dielectric material 18 is an oxide such as $SiO_2$. In accordance with the present invention, dielectric material 18 has a thickness of from about 2 to about 5 microns, with a thickness of from about 3 to about 4 microns being more highly preferred.

Following formation of dielectric material 18 on the surface of material stack 12, the dielectric material is patterned utilizing conventional lithography and etching so as to form openings 20 (one of which is shown in each area of the substrate in FIG. 3) exposing a portion of etch stop layer 16. The lithography step employed in the present invention includes: applying a photoresist (not shown) to dielectric material 18, exposing the photoresist to a pattern of radiation and developing the pattern by utilizing a conventional resist developer.

The etching process employed during this step of the present invention includes a dry etching process such as reactive-ion etching (RIE), plasma-etching, ion beam etching and laser ablation or a wet chemical etching process in which a chemical etchant is employed. Notwithstanding which type of etching process is employed, the etching process must be highly selective in removing dielectric material 18, while being able to stop on etch stop layer 16.

Figure 3:
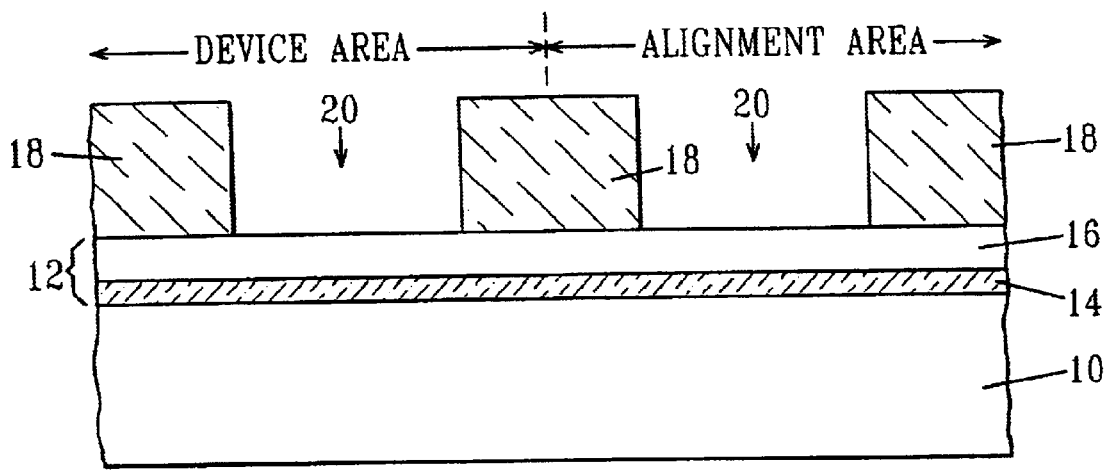

Next, the patterned photoresist is removed from the structure utilizing a conventional resist stripping process well known to those skilled in the art providing the structure shown in FIG. 3.

In one embodiment of the present invention (which is not shown in the drawings), and following the etch of dielectric material 18 and resist strip, etch stop layer 16 may be etched using opening 20 as the etch mask with the etch stopping on pad layer 14. Hence, the deep subcollector region may be implanted through layers 16 and 14 masked by dielectric material 18 or through pad layer 14 only, masked by films 18 and 16.

Figure 4:
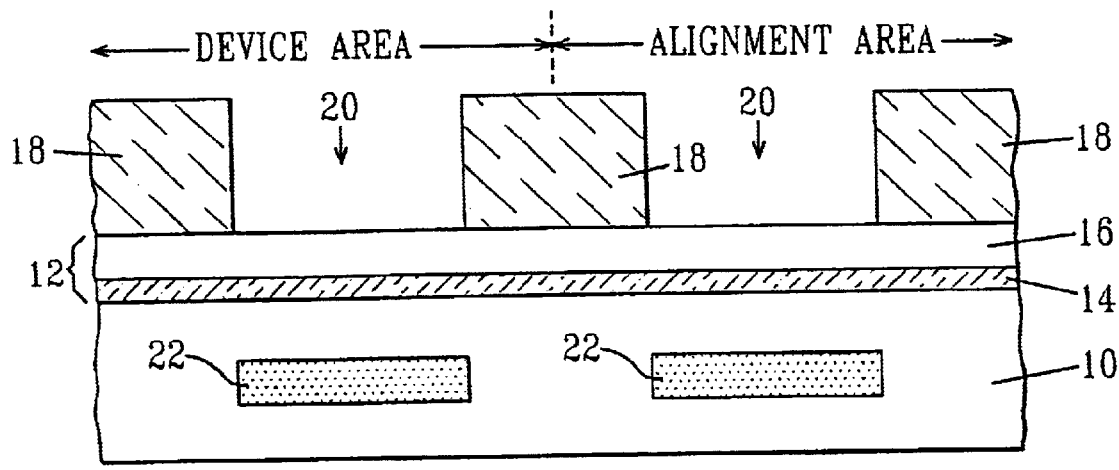

The patterned dielectric layer provided above is employed in the present invention as an ion implantation mask. Specifically, the patterned structure shown in FIG. 3 is subjected to a high-energy/high-dose ion implantation process which is capable of forming at least one deep subcollector region in the underlying semiconductor substrate. The resultant structure that is obtained after the high-energy/high-dose implant step is shown, for example, in FIG. 4. In this figure, reference numeral 22 refers to the implanted deep subcollector region. Although the drawings depict the formation of only one deep subcollector region in each area (i.e., device area and alignment area) of the substrate, the present invention works in forming more than one deep subcollector region in each area present in the substrate.

As stated above, deep subcollector region 22 is formed (through the opening and the material stack) by utilizing a high-energy/high-dose implantation process. The term "high-energy/high-dose implant" is used herein to refer to an ion implantation process that is carried out at an energy of about 600 keV or higher using a dopant dosage of about $1E14$ atoms/$cm^2$ or greater. Specifically, the high-energy/high-dose ion implantation step of the present invention is carried out at an energy of from about 600 keV to about 4 MeV using a dopant dosage of from about $1E14$ to about $5E15$ atoms/$cm^2$. The dopants used in forming subcollector region 22 vary depending on the type of device that is to be fabricated. Illustrative examples of dopants that can be employed in this step of the present invention include, but are not limited to: P, As, Sb and B.

It is noted that the term "deep subcollector region" is used herein to denote a subcollector region that is implanted to a depth of greater than about 0.3 micron into the semiconductor substrate. Specifically, the deep subcollector region of the present invention is implanted to a depth that is from about 0.5 to about 3 micron beneath the surface of substrate 10. The depth reported herein is from the top surface of semiconductor substrate 10.

Figure 5:
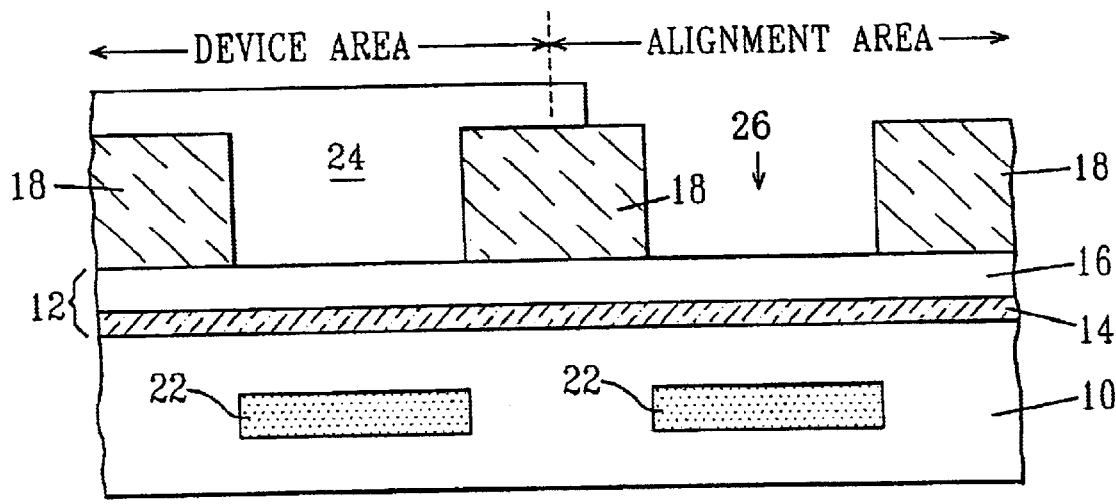

In one embodiment of the present invention, lithography is then employed in forming second patterned layer 24 on said first patterned layer, i.e., on patterned dielectric material 18, See FIG. 5. In accordance with the present invention, second patterned layer is formed predominately outside of the alignment area of the structure. Specifically, in one embodiment of the present invention, the structure shown in FIG. 5 is formed by first applying a conventional resist to the structure shown in FIG. 4 utilizing a conventional deposition process such as spin coating, CVD, plasma-assisted CVD, evaporation and other like deposition processes. The resist is then subjected to a pattern of radiation and the patterned resist is developed using a conventional resist developer. In this patterning step of the present invention, the exposure and development steps form patterned second layer 24 that has openings 26 (one of which is shown in FIG. 5). Note that opening 26 is used in forming an alignment mark in semiconductor substrate 10.

In another embodiment of the present invention, second patterned layer 24 is a patterned dielectric material which may be the same or different from the first patterned dielectric. When this embodiment is employed, second patterned layer 24 is formed using the same processing steps used in forming the first patterned layer. Note that the structure shown in FIG. 5 is also applicable to this embodiment of the present invention.

The alignment mark is then transferred into substrate 10 by etching through exposed portions of material stack 12 including etch stop layer 16 and pad layer 14 and a portion of substrate 10 so as to form self-aligned alignment mark 28 in semiconductor substrate 10. Note that the alignment mark produced herein is self-aligned to the edges of the deep subcollector region previously formed in the substrate. This enables higher transistor packing densities than if not self-aligned.

Figure 6:
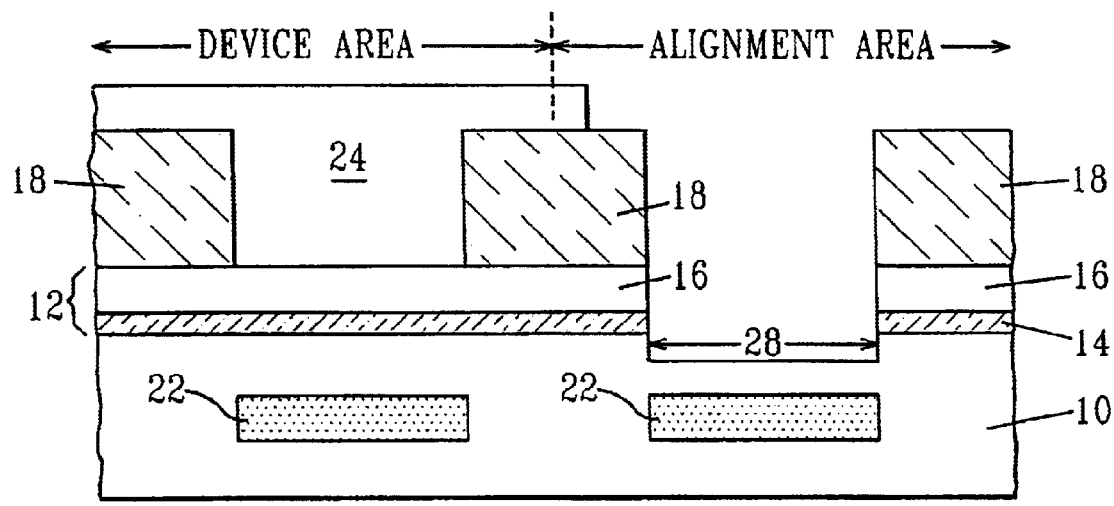

The etching process used in transferring the alignment mark into the substrate includes the use of any of the above-mentioned etching processes, including RIE. The second patterned layer is then removed from the structure utilizing a conventional resist stripping process providing the structure shown in FIG. 6.

Figure 7:
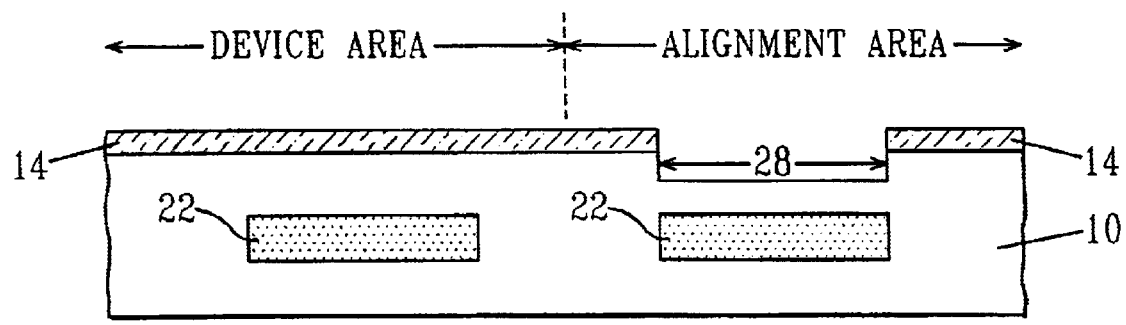

Following removal of the second patterned layer, the first patterned layer, i.e., dielectric layer 18, and optionally etch stop layer 16 are removed from the structure utilizing conventional etching processes that are capable of removing each of the aforementioned layers. For example, patterned dielectric 18 may be removed by an HF based wet oxide etch, whereas the etch stop layer may be removed by a nitride etchant such as hot phosphoric acid. FIG. 7 shows the final structure of the present invention after removing both the first patterned dielectric layer and the etch stop layer.

In some embodiments of the present invention, the etch stop layer may remain in the structure and can be used in subsequent etching processes. For example, the etch stop layer may be used to form the shallow trench isolation (STI) regions or local oxidation of silicon (LOCOS) isolation regions. The inventive method described above can be used in conjunction with conventional BiCMOS or CMOS processes in forming various devices such as bipolar devices. Since the BiCMOS and CMOS processing steps are conventional, a detailed description concerning the same is not provided herein.

The inventive method described above and illustrated in FIGS. 1–7 provides the following advantages over prior art processes:

The patterned dielectric mask used for the high-energy/high-dose implant typically has a sidewall angle of about 88°. This mask allows for much tighter device spaces, closer ground rules, and hence denser transistor layouts.

The patterned dielectric mask employed in the present invention does not erode during the high-energy/high-dose implant step.

The inventive processing steps employed allow for higher energy/higher dose implants that are not feasible with conventional resists.

The inventive processing steps employed can be integrated with a first alignment strategy.

The inventive processing steps employed can be integrated with other etching processes as well as with conventional BiCMOS or CMOS processing steps.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms described and illustrated herein, but fall within the scope of the appended claims.

Having thus described our invention in detail, what we claim is new and desire to secure by the Letters Patent is:

1. A method of forming a deep subsollector region with self-aligned alignment marks comprising the steps of:
   (a) lithographically forming a first patterned layer comprising a thick dielectric material on a surface of a material stack formed on a semiconductor substrate, said first patterned layer including at least one opening therein and said semiconductor substrate having at least an alignment area;
   (b) performing a high-energy/high-dose implant through said at least one opening and said material stack so as to form at least one deep subcollector region in said semiconductor substrate;
   (c) lithographically forming a second patterned layer predominately outside the first patterned layer in said alignment area; and
   (d) etching through said material stack in said alignment area to form alignment marks in the underlying semiconductor substrate using said first patterned layer as an alignment mark mask, said alignment marks are self-aligned to edges of said at least one deep subcollector region.

2. The method of claim 1 wherein said material stack comprises a pad layer and an etch stop layer.

3. The method of claim 2 wherein said pad layer is an oxide and said etch stop layer is a nitride.

4. The method of claim 2 wherein said pad layer is formed by a thermal growing process or a deposition process.

5. The method of claim 1 wherein said semiconductor substrate is comprised of Si, SiGe, GaAs, InAs, InP, Si/Si, Si/SiGe and silicon-on-insulators.

6. The method of claim 1 wherein said dielectric material is composed of an oxide or oxynitride.

7. The method of claim 1 wherein said dielectric material has a thickness of from about 2 to about 5 microns.

8. The method of claim 7 wherein said dielectric material has a thickness of from about 3 to about 4 microns.

9. The method of claim 1 wherein step (a) includes applying a photoresist to said dielectric material; exposing said photoresist to a pattern of radiation; developing the pattern; and etching.

10. The method of claim 9 wherein said etching step comprises a dry etching process selected from the group consisting of reactive-ion etching, ion beam etching, plasma etching and laser ablation.

11. The method of claim 1 wherein said high-energy/high-dose implant is carried out using an implant energy of about 600 keV or greater and a dopant dosage of about 1E14 atoms/cm$^2$ or greater.

12. The method of claim 11 wherein said high-energy/high-dose implant is carried out using an implant energy of from about 600 keV to about 4 MeV and a dopant dosage of from about 1E14 to about 5E15 atoms/cm$^2$.

13. The method of claim 1 wherein said deep subcollector region is implanted to a depth of about 0.3 micron or greater.

14. The method of claim 13 wherein said deep subcollector regions is implanted to a depth of from about 0.5 to about 3 micron.

15. The method of claim 1 wherein said high-energy/high-dose implant employs a dopant ion selected from P, As, Sb and B.

16. The method of claim 1 wherein step (c) includes applying a resist; exposing said resist to a pattern of radiation; and developing the exposed resist.

17. The method of claim 1 wherein step (c) includes forming a second dielectric material on said first patterned layer and in said at least one opening; applying a resist to said second dielectric material; exposing said resist to a pattern of radiation; developing said exposed resist and transforming said pattern to said second dielectric material.

18. The method of claim 1 wherein step (d) includes a dry etching process selected from the group consisting of reactive ion etching, ion beam etching, plasma etching and laser ablation.

19. The method of claim 1 wherein said second patterned layer and said first patterned layer are removed after step (d).

20. The method of claim 2 wherein said etch stop layer is removed after removing said first and second patterned layers.

21. The method of claim 2 wherein said etch stop layer remains on said pad layer after removing said first and second patterned layers.

22. The method of claim 21 wherein said etch stop layer is employed in forming isolation regions.

* * * * *